(12) United States Patent
Eaton

(10) Patent No.: US 8,604,825 B2
(45) Date of Patent: Dec. 10, 2013

(54) RADIATION HARDENED CIRCUIT DESIGN FOR MULTINODE UPSETS

(75) Inventor: Paul Eaton, Albequerque, NM (US)

(73) Assignee: Micro RDC, Colorado Springs, CO (US)

( * ) Notice: Subject to any disclaimer, the term of this patent is extended or adjusted under 35 U.S.C. 154(b) by 0 days.

(21) Appl. No.: 13/345,308

(22) Filed: Jan. 6, 2012

(65) Prior Publication Data

US 2012/0182048 A1 Jul. 19, 2012

Related U.S. Application Data

(60) Provisional application No. 61/434,003, filed on Jan. 19, 2011.

(51) Int. Cl.
*H03K 19/003* (2006.01)

(52) U.S. Cl.
USPC ............... 326/9; 326/10; 326/13; 326/122

(58) Field of Classification Search
None
See application file for complete search history.

(56) References Cited

U.S. PATENT DOCUMENTS

| | | | | |
|---|---|---|---|---|
| 5,307,142 A | * | 4/1994 | Corbett et al. | 365/156 |
| 5,525,923 A | * | 6/1996 | Bialas et al. | 327/210 |
| 2003/0117221 A1 | * | 6/2003 | Knowles et al. | 331/57 |
| 2007/0063728 A1 | * | 3/2007 | Briet et al. | 326/14 |

* cited by examiner

Primary Examiner — Anh Tran
(74) Attorney, Agent, or Firm — Todd L. Juneau

(57) ABSTRACT

This invention relates to Multiple Interlocked Cells (MICE) design as a hardening technique for CMOS logic gates consisting of two or more redundant nodes with node isolation components. This technique is used to modify existing standard CMOS logic gates or create new complex logic gates using common mask layers existing at ultra-deep sub-micron CMOS foundries. For single node upset immunity in logic or register, a primary cell and a redundant cell are used. For multi-node immunity, the primary cell is combined with two or more redundant nodes are used with physical layout spacing techniques which will insure that a single particle track cannot upset all three nodes simultaneously, and logic circuits built using this technique are immune to upsets in any environment. Circuits built using the MICE technique are also immune to single event transients without requiring the large time delays used in other hardening techniques.

18 Claims, 12 Drawing Sheets

RADIATION HARDENED CIRCUIT DESIGN FOR MULTINODE UPSETS

CROSS REFERENCE TO RELATED APPLICATIONS

Not applicable.

STATEMENT REGARDING FEDERALLY SPONSORED RESEARCH OR DEVELOPMENT

No federal government funds were used in researching or developing this invention.

NAMES OF PARTIES TO A JOINT RESEARCH AGREEMENT

Not applicable.

BACKGROUND

1. Field of the Invention

This invention relates to a new logic family style that can be created using any modern CMOS fabrication process and can be tuned to any desirable hardening level up to multiple node upset immunity.

2. Background of the Invention

The current state of knowledge is as follows. Design of electronics for radiation environments has been notoriously difficult. Problems arise from changes in circuit performance (leakage currents, transistor drive degradation) that can be caused by the total ionizing dose radiation over time. Certain structures are susceptible to latchup events that can cause a performance loss and even permanent damage to the circuit structures. The CMOS devices are also known to be sensitive to upsets caused by an energized particle passing through a circuit region, depositing enough charge to change the state of the circuit node.

There are many known techniques have proven effective for mitigation of latchup and TID issues through the use of layout techniques (referred to as hardened by design) and/or fabrication (hardened processing). As technology fabrication technologies advance further into the ultra-deep-submicron region, the many standard bulk foundries have shown to have greater immunity to TID and SEL without any modifications to their commercial process. Advances in the processing materials and the decrease in gate oxide thickness allow greater immunity to TID effects. Lower operating voltages and control of the well resistivity can lead to virtually eliminating SEL issues in modern designs. As these TID and SEL issues become less intrusive in the advanced CMOS technologies, the heavy-ion induced single-event upset (SEU) and single-event transient (SET) errors have become the dominant issue remaining for modern circuit designs.

The primary goal of moving to a new technology from an older technology node is to increase circuit performance and design density. Circuit performance increases are generally based on the reduction of capacitance from the smaller feature sizes. This reduction of capacitance also reduces the amount of charge needed to change the state of the circuit node, which means the circuit nodes are becoming much more susceptible to heavy-ion upsets. The improvement in circuit density is created by the ability of placing a greater number of smaller transistors in a smaller region than previously possible. This crowding also makes it much easier to upset multiple nodes simultaneously from a single ion strike. In the true space environment, the heavy ion particles will be impacting the circuit from all possible angles. It is possible that a single particle could pass through a device just below the surface of the active components and travel parallel with the design, depositing charge to all nodes along the trajectory of this particle. Unlike the decreasing TID and SEL phenomena, the advancement created in modern fabrication processes have shown more prevalent heavy-ion induced upsets, and known hardening techniques are becoming impractical for implementation (at best) or virtually ineffective at mitigating these errors.

Accordingly, there is a need for a new logic family style that can be created using any modern CMOS fabrication process and can be tuned to any desirable hardening level up to multiple node upset immunity.

BRIEF SUMMARY OF THE INVENTION

This invention concerns an integrated circuit (IC) that implements a logic family that is immune to single event transients (SET) and single event upsets (SEU) at a single node, or from a linear strike can upset multiple nodes, such as those caused by a cosmic ray impacting the IC device. The circuit has isolated nodes which, during a heavy-ion strike, will only switch from driving the downstream logic to a tri-state.

In one implementation, the logic cells include three identical nodes for the PMOS transistors and three identical nodes for the NMOS transistors, and include standard CMOS devices to provide isolation to each node. During normal circuit operation, these nodes operate in a redundant fashion, all three producing identical output values when given identical input values.

Logic immunity is achieved in this architecture by: (1) isolating any struck node to prevent the error from propagating through the circuit, and (2) providing a means to recover the correct logic state in any circuit connected to the upset node through the redundant datapaths.

In one preferred embodiment of the present invention, there is provided a MICE Logic gate containing three (3) split logic gates, each split logic gate containing three (3) logic functions with an isolation device between each connecting node, each logic function containing one (1) NMOS logic block and one (1) PMOS logic block, wherein the NMOS logic block is a single NMOS transistor, and wherein the PMOS logic block is a single PMOS transistor, and wherein the NMOS logic blocks are not in a linear track, and the PMOS logic blocks are not in a linear track.

In another preferred embodiment of the present invention, there is provided a MICE logic cell containing three (3) logic functions, with a coupling between each of said logic functions using two (2) or more isolation devices, each logic function containing one (1) NMOS logic block and one (1) PMOS logic block, wherein the NMOS logic block is a single NMOS transistor, and wherein the PMOS logic block is a single PMOS transistor, wherein using two (2) or more isolation devices between the logic functions provides that each NMOS logic block is coupled to two (2) or more of the PMOS logic blocks through at least one of the two (2) or more isolation devices, and provides that each PMOS logic block is coupled to two (2) or more NMOS logic blocks through at least one of the two (2) or more isolation devices, wherein the two or more isolation devices allow the logic cell to contain a struck node, and wherein the two (2) or more of the PMOS logic blocks oppose the two (2) or more NMOS logic blocks and the opposing logic blocks help speed up recovery time of the struck node, and wherein the two or more NMOS logic blocks are not in a linear track, and the two or more PMOS logic blocks are not in a linear track.

In another preferred embodiment of the present invention, there is provided a method of isolating a p-mos and n-mos network from a heavy ion strike comprising the step of providing a redundant semiconductor logic chip architecture having at least two identical p-mos logic sub-blocks and at least two identical n-mos logic sub-blocks, wherein the p-mos sub-blocks are isolated from each other and the n-mos sub-blocks are isolated from each other, said isolated sub-blocks isolated using an chip architecture design wherein a heavy ion strike will cause an output which if presented as an input to a downstream circuit of the same architecture will not cause the downstream circuit to change state.

In another preferred embodiment of the present invention, there is provided a method of isolating a network having a pull up evaluation function and a pull down evaluation function from a heavy ion strike comprising the step of providing a redundant semiconductor logic chip architecture having at least two identical pull up evaluation functions and at least two identical pull down evaluation functions, wherein the pull up evaluation functions are isolated from each other and the at least two identical pull down evaluation functions are isolated from each other, said isolated pull-up/pull-down evaluation functions isolated using an chip architecture design wherein a heavy ion strike will cause an output which if presented as an input to a downstream circuit of the same architecture will not cause the downstream circuit to change state, and interconnecting these circuits in such a way that double-redundancy prevents single-node upsets (SNUs) and triple-redundancy prevent multi-node upsets (MNUs).

In another preferred embodiment of the present invention, there is provided a circuit architecture which produces an output signal incorporating a signature that will not revert to an incorrect signal when arriving at the input of another circuit of the same architecture.

In another preferred embodiment of the present invention, there is provided a logic block for performing a function having inputs and outputs, wherein this logic block feeds another block and would produce a correct output.

In another preferred embodiment of the present invention, there is provided a hardened circuit having a plurality of logic cells for performing a logic function, that comprises:

a first CMOS gate wherein the first CMOS gate is broken into a first PMOS block that parallels a first NMOS block, wherein the first PMOS block has at least one connection node to the first NMOS block, and wherein each connection node between the first PMOS block and the first NMOS block is an isolation device, wherein the first PMOS block comprises a plurality of PMOS gates in series and/or parallel combinations, wherein the first NMOS block comprises a plurality of NMOS gates in series and/or parallel combinations, wherein the first CMOS gate comprises one or more PMOS inputs and an output connected to the first PMOS block, and one or more NMOS inputs and an output connected to the first NMOS block, and wherein the first CMOS gate has a Voltage drain and source;

a second CMOS gate wherein the second CMOS gate is broken into a second PMOS block that parallels a second NMOS block, wherein the second PMOS block has at least one connection node to the second NMOS block, and wherein each connection node between the second PMOS block and the second NMOS block is an isolation device, wherein the second PMOS block comprises a plurality of PMOS gates in series and/or parallel combinations, wherein the second NMOS block comprises a plurality of NMOS gates in series and/or parallel combinations, wherein the second CMOS gate comprises one or more PMOS inputs and an output connected to the second PMOS block, and one or more NMOS inputs and an output connected to the second NMOS block, and wherein the second CMOS gate has a Voltage drain and source; and an isolation device that connects the first CMOS gate to the second CMOS gate.

In alternative preferred embodiments of the present invention, there is a hardened circuit wherein: the first CMOS gate is configured to be an inverter; or wherein the first CMOS gate is configured to be a flip-flop; or wherein the first CMOS gate is configured to be a NAND gate; or wherein the NAND gate is combined with an inverter to form an AND gate; or wherein the first CMOS gate is configured to be a NOR gate; or wherein the first CMOS gate is configured to be a register.

In another preferred embodiment of the present invention, there is a split logic function for use as a component of a multiple interlocked (MICE) logic cell where the split logic function comprises:

a PMOS network connected with an isolation device to an NMOS network, wherein the PMOS network comprises a plurality of PMOS gates in series, and wherein the NMOS network comprises a plurality of NMOS gates in series equal to the number of PMOS gates, wherein the split logic function comprises a PMOS input and output connected to the PMOS network, and a NMOS input and output connected to the NMOS network, and wherein the split logic function has a Voltage drain and source.

In alternative preferred embodiments of the present invention, there is a split logic function wherein the isolation device is a resistor; or the split logic function is configured to be an inverter; or the split logic function is configured to be a flip-flop; or the split logic function is configured to be a NAND gate; or the split logic function is configured to be an AND gate; or the split logic function is configured to be a NOR gate; or the split logic function is configured to be a register; or wherein the plurality of PMOS gates is two PMOS gates in series, wherein the plurality of NMOS gates is two NMOS gates in series, and wherein each PMOS gate and NMOS gate has an input and an output; or wherein the plurality of PMOS gates is at least three PMOS gates in series, and wherein the plurality of NMOS gates is at least three NMOS gates in series, and wherein each PMOS gate and NMOS gate has an input and an output; or wherein the plurality of PMOS gates is at least four PMOS gates in series, and wherein the plurality of NMOS gates is at least four NMOS gates in series, and wherein each PMOS gate and NMOS gate has an input and an output.

In alternative preferred embodiments of the present invention, there is a circuit architecture described by FIG. 4.

In alternative preferred embodiments of the present invention, there is a method of maintaining logic functions during a radiation-induced multi-node upset by implementing the logic shown in the circuit of FIG. 4 in a microcontroller environment.

In alternative preferred embodiments of the present invention, there is a multiple interlocked logic cell comprising at least three of the split logic functions described herein, wherein each of the split logic functions is connected by an isolation device to another split logic function.

In alternative preferred embodiments of the present invention, there is a circuit architecture described by FIG. 12.

In alternative preferred embodiments of the present invention, there is a method of maintaining logic functions during a radiation-induced multinode upset by implementing the logic shown in the circuit of FIG. 12 in a microcontroller environment.

In one preferred embodiment of the present invention, there is provided a hardened circuit having three logic cells for performing a logic function that comprises:

(1) a first logic cell having three parallel CMOS transistor stacks T1-T2-T3 and one shared isolation device R1, the first CMOS transistor stack T1 comprising a complementary pair of PMOS-NMOS semiconductor transistor gates P01-N01 between source terminal Vss-01 and drain terminal Vdd-01, the second CMOS transistor stack T2 comprising a complementary pair of PMOS-NMOS semiconductor transistor gates P02-N02 between source terminal Vss-02 and drain terminal Vdd-02, the third CMOS transistor stack T3 comprising a complementary pair of PMOS-NMOS semiconductor transistor gates P03-N03 between source terminal Vss-03 and drain terminal Vdd-03, and said shared isolation device R1 coupling the drain terminals to the source terminals of CMOS transistor stacks T1-T2-T3;

(2) a second logic cell having three parallel CMOS transistor stacks T4-T5-T6 and one shared isolation device R2, the first CMOS transistor stack T4 comprising a complementary pair of PMOS-NMOS semiconductor transistor gates P04-N04 between source terminal Vss-04 and drain terminal Vdd-04, the second CMOS transistor stack T2 comprising a complementary pair of PMOS-NMOS semiconductor transistor gates P05-N05 between source terminal Vss-05 and drain terminal Vdd-05, the third CMOS transistor stack T6 comprising a complementary pair of PMOS-NMOS semiconductor transistor gates P06-N06 between source terminal Vss-06 and drain terminal Vdd-06, and said shared isolation device R2 coupling the drain terminals to the source terminals of CMOS transistor stacks T4-T5-T6;

(3) a third logic cell having three parallel CMOS transistor stacks T7-T8-T9 and one shared isolation device R3, the first CMOS transistor stack T7 comprising a complementary pair of PMOS-NMOS semiconductor transistor gates P07-N07 between source terminal Vss-07 and drain terminal Vdd-07, the second CMOS transistor stack T8 comprising a complementary pair of PMOS-NMOS semiconductor transistor gates P08-N08 between source terminal Vss-08 and drain terminal Vdd-08, the third CMOS transistor stack T9 comprising a complementary pair of PMOS-NMOS semiconductor transistor gates P09-N09 between source terminal Vss-09 and drain terminal Vdd-09, and said shared isolation device R3 coupling the drain terminals to the source terminals of CMOS transistor stacks T7-T8-T9; each logic cell having three pairs of redundant inputs and 1 pair of output, wherein input pair In1_P/N_v1 is redundantly connected to transistor stack T1, transistor stack T4, and transistor stack T7;

wherein input pair In1_P/N_v2 is redundantly connected to transistor stack T2, transistor stack T5, and transistor stack T8;

wherein input pair In1_P/N_v3 is redundantly connected to transistor stack T3, transistor stack T6, and transistor stack T9;

wherein output pair Out1_P/N_v1 is connected to the first logic cell containing transistor stacks T1-T2-T3;

wherein output pair Out1_P/N_v2 is connected to the second logic cell containing transistor stacks T4-T5-T6; and wherein output pair Out1_P/N_v3 is connected to the third logic cell containing transistor stacks T7-T8-T9.

In another preferred embodiment of the present invention, there is provided a hardened circuit having two logic cells for performing a logic function that comprises:

1) a first logic cell having four parallel CMOS transistor stacks T1-T2-T5-T6 and two shared isolation devices R1 and R2, the first CMOS transistor stack T1 comprising a complementary pair of PMOS-NMOS semiconductor transistor gates P01-N01 between source terminal Vss-01 and drain terminal Vdd-01; the second CMOS transistor stack T2 comprising a complementary pair of PMOS-NMOS semiconductor transistor gates P02-N02 between source terminal Vss-02 and drain terminal Vdd-02; and said shared isolation device R1 coupling the drain terminals to the source terminals of CMOS transistor stacks T1-T2; the third CMOS transistor stack T5 comprising a complementary pair of PMOS-NMOS semiconductor transistor gates P05-N05 between source terminal Vss-05 and drain terminal Vdd-05; the fourth CMOS transistor stack T6 comprising a complementary pair of PMOS-NMOS semiconductor transistor gates P06-N06 between source terminal Vss-06 and drain terminal Vdd-06; and said shared isolation device R2 coupling the drain terminals to the source terminals of CMOS transistor stacks T5-T6;

2) a second logic cell having four parallel CMOS transistor stacks T3-T4-T7-T8 and two shared isolation devices R3 and R4, the first CMOS transistor stack T3 comprising a complementary pair of PMOS-NMOS semiconductor transistor gates P03-N03 between source terminal Vss-03 and drain terminal Vdd-03; the second CMOS transistor stack T4 comprising a complementary pair of PMOS-NMOS semiconductor transistor gates P04-N04 between source terminal Vss-04 and drain terminal Vdd-04; and said shared isolation device R3 coupling the drain terminals to the source terminals of CMOS transistor stacks T3-T4; the third CMOS transistor stack T7 comprising a complementary pair of PMOS-NMOS semiconductor transistor gates P07-N07 between source terminal Vss-07 and drain terminal Vdd-07; the fourth CMOS transistor stack T8 comprising a complementary pair of PMOS-NMOS semiconductor transistor gates P08-N08 between source terminal Vss-08 and drain terminal Vdd-08; and said shared isolation device R4 coupling the drain terminals to the source terminals of CMOS transistor stacks T7-T8;

each logic cell having two pairs of redundant inputs and 2 pairs of outputs, wherein input pair In1_P/N_v1 is redundantly connected to transistor stack T1, and transistor stack T3;

wherein input pair In1_P/N_v2 is redundantly connected to transistor stack T2, and transistor stack T4;

wherein the inputs for transistor stack T5 and transistor stack T7 are internal redundant inputs from the output of transistor stacks T1-T2;

wherein the inputs for transistor stack T6 and transistor stack T8 are internal redundant inputs from the output of transistor stacks T3-T4;

wherein output pair Out1_P/N_v1 is connected to the first logic cell containing transistor stacks T1-T2-T5-T6; and, wherein output pair Out1_P/N_v2 is connected to the second logic cell containing transistor stacks T3-T4-T7-T8.

In another preferred aspect of the invention, there is provided a hardened circuit having three logic cells for performing a logic function that comprises:

1) a first logic cell having four parallel CMOS transistor stacks T1-T2-T7-T8 and two shared isolation devices R1 and R2, the first CMOS transistor stack T1 comprising a complementary pair of PMOS-NMOS semiconductor transistor gates P01-N01 between source terminal Vss-01 and drain terminal Vdd-01; the second CMOS transistor stack T2 comprising a complementary pair of PMOS-NMOS semiconductor transistor gates P02-N02 between source terminal Vss-02 and drain terminal Vdd-02; and said shared isolation device R1 coupling the drain terminals to the source terminals of CMOS transistor stacks T1-T2; the third CMOS transistor stack T7 comprising a complementary pair of PMOS-NMOS semiconductor transistor gates P07-N07 between source terminal Vss-07 and drain terminal Vdd-07; the fourth CMOS transistor stack T8 comprising a complementary pair of PMOS-NMOS semiconductor transistor gates P08-N08 between source terminal Vss-08 and drain terminal Vdd-08; and said shared isolation device R2 coupling the drain terminals to the source terminals of CMOS transistor stacks T7-T8;

2) a second logic cell having four parallel CMOS transistor stacks T3-T4-T9-T10 and two shared isolation devices R3 and R4, the first CMOS transistor stack T3 comprising a complementary pair of PMOS-NMOS semiconductor transistor gates P03-N03 between source terminal Vss-03 and drain terminal Vdd-03; the second CMOS transistor stack T4 comprising a complementary pair of PMOS-NMOS semiconductor transistor gates P04-N04 between source terminal Vss-04 and drain terminal Vdd-04; and said shared isolation device R3 coupling the drain terminals to the source terminals of CMOS transistor stacks T3-T4; the third CMOS transistor stack T9 comprising a complementary pair of PMOS-NMOS semiconductor transistor gates P09-N09 between source terminal Vss-09 and drain terminal Vdd-09; the fourth CMOS transistor stack T10 comprising a complementary pair of PMOS-NMOS semiconductor transistor gates P10-N10 between source terminal Vss-10 and drain terminal Vdd-10; and said shared isolation device R4 coupling the drain terminals to the source terminals of CMOS transistor stacks T9-T10;

3) a third logic cell having four parallel CMOS transistor stacks T5-T6-T11-T12 and two shared isolation devices R5 and R6, the first CMOS transistor stack T5 comprising a complementary pair of PMOS-NMOS semiconductor transistor gates P05-N05 between source terminal Vss-05 and drain terminal Vdd-05; the second CMOS transistor stack T6 comprising a complementary pair of PMOS-NMOS semiconductor transistor gates P06-N06 between source terminal Vss-06 and drain terminal Vdd-06; and said shared isolation device R5 coupling the drain terminals to the source terminals of CMOS transistor stacks T5-T6; the third CMOS transistor stack T11 comprising a complementary pair of PMOS-NMOS semiconductor transistor gates P11-N11 between source terminal Vss-11 and drain terminal Vdd-11; the fourth CMOS transistor stack T12 comprising a complementary pair of PMOS-NMOS semiconductor transistor gates P12-N12 between source terminal Vss-12 and drain terminal Vdd-12; and said shared isolation device R6 coupling the drain terminals to the source terminals of CMOS transistor stacks T11-T12;

each logic cell having two pairs of redundant inputs and 2 pairs of outputs, wherein input pair In1_P/N_v1 is redundantly connected to transistor stack T1, and transistor stack T3;

wherein input pair In1_P/N_v2 is redundantly connected to transistor stack T2, and transistor stack T5;

wherein input pair In1_P/N_v3 is redundantly connected to transistor stack T4, and transistor stack T6;

wherein the inputs for transistor stack T7 and transistor stack T8 are internal redundant inputs from the output of transistor stacks T1-T2;

wherein the inputs for transistor stack T9 and transistor stack T10 are internal redundant inputs from the output of transistor stacks T3-T4;

wherein the inputs for transistor stack T11 and transistor stack T12 are internal redundant inputs from the output of transistor stacks T5-T6;

wherein output pair Out1_P/N_v1 is connected to the first logic cell containing transistor stacks T1-T2-T7-T8;

wherein output pair Out1_P/N_v2 is connected to the second logic cell containing transistor stacks T3-T4-T9-T10; and, wherein output pair Out1_P/N_v3 is connected to the second logic cell containing transistor stacks T5-T6-T11-T12.

In yet another preferred embodiment of the present invention, there is provided a hardened circuit having a single logic cell for performing a logic function, comprising: two parallel CMOS transistor stacks T1-T2 and four shared isolation devices R1-R2-R3-R4; the first CMOS transistor stack T1 comprising a complementary pair of PMOS-NMOS semiconductor transistor gates P01-N01 between source terminal Vss-01 and drain terminal Vdd-01; the second CMOS transistor stack T2 comprising a complementary pair of PMOS-NMOS semiconductor transistor gates P02-N02 between source terminal Vss-02 and drain terminal Vdd-02; and said shared isolation devices R1-R2-R3-R4 coupling the drain terminals to the source terminals of CMOS transistor stacks T1-T2;

wherein input pair In1_P/N_v1 is connected to transistor stack T1;

wherein input pair In1_P/N_v2 is connected to transistor stack T2;

wherein output pair Out_P/N_01 and output pair Out_P/N_02 define four signal pathways P01, N01, P02, and N02;

signal pathway P01 connects gate P01 to Out_P01 via node P01-R1 and node P01-R2, wherein node P01-R1 is connected to isolation device R1 and node P01-R2 is connected to isolation device R2;

signal pathway P02 connects gate P02 to Out_P02 via node P02-R3 and node P02-R4, wherein node P02-R3 is connected to isolation device R3 and node P02-R4 is connected to isolation device R4;

signal pathway N01 connects gate N01 to Out_N01 via node N01-R1 and node N01-R4, wherein node N01-R1 is connected to isolation device R1 and node N01-R4 is connected to isolation device R4;

signal pathway N02 connects gate N02 to Out_N02 via node N02-R3, wherein node N02-R3 is connected to isolation device R3;

wherein signal pathway P01 is connected to signal pathway N02 between node P01-R2 and node N02-R3 via cross-linking resistive path through isolation device R2; and, wherein signal pathway P02 is connected to signal pathway N01 between nodes P02-R4 and node N01-R4 via cross-linking resistive path through isolation device R4.

In another preferred embodiment of the present invention, there is provided a hardened circuit having a single logic cell for performing a logic function, comprising: three parallel CMOS transistor stacks T1-T2-T3 and six shared isolation devices R1-R2-R3-R4-R5-R6; the first CMOS transistor stack T1 comprising a complementary pair of PMOS-NMOS semiconductor transistor gates P01-N01 between source terminal Vss-01 and drain terminal Vdd-01; the second CMOS transistor stack T2 comprising a complementary pair of PMOS-NMOS semiconductor transistor gates P02-N02 between source terminal Vss-02 and drain terminal Vdd-02; the third CMOS transistor stack T3 comprising a complementary pair of PMOS-NMOS semiconductor transistor gates P03-N03 between source terminal Vss-03 and drain terminal Vdd-03; and said shared isolation devices R1-R2-R3-R4 coupling the drain terminals to the source terminals of CMOS transistor stacks T1-T2-T3;
wherein input pair In1_P/N_v1 is connected to transistor stack T1;
wherein input pair In1_P/N_v2 is connected to transistor stack T2;
wherein input pair In1_P/N_v3 is connected to transistor stack T3;
wherein output pair Out_P/N_01, output pair Out_P/N_02, and output pair Out_P/N_03 define six signal pathways P01, N01, P02, N02, P03, and N03;
signal pathway P01 connects gate P01 to Out_P01 via node P01-R1 and node P01-R2, wherein node P01-R1 is connected to isolation device R1 and node P01-R2 is connected to isolation device R2;
signal pathway P02 connects gate P02 to Out_P02 via node P02-R3 and node P02-R4, wherein node P02-R3 is connected to isolation device R3 and node P02-R4 is connected to isolation device R4;
signal pathway P03 connects gate P03 to Out P03 via node P03-R5 and node P03-R6, wherein node P03-R5 is connected to isolation device R5 and node P03-R6 is connected to isolation device R6;
signal pathway N01 connects gate N01 to Out_N01 via node N01-R1 and node N01-R6, wherein node N01-R1 is connected to isolation device R1 and node N01-R6 is connected to isolation device R6;
signal pathway N02 connects gate N02 to Out_N02 via node N02-R3, wherein node N02-R3 is connected to isolation device R3;
signal pathway N03 connects gate N03 to Out_N03 via node N03-R5, wherein node N03-R5 is connected to isolation device R5;
wherein signal pathway P01 is connected to signal pathway N02 between node P01-R2 and node N02-R3 via cross-linking resistive path through isolation device R2;
wherein signal pathway P02 is connected to signal pathway N03 between node P02-R4 and node N03-R5 via cross-linking resistive path through isolation device R4; and,
wherein signal pathway P03 is connected to signal pathway N01 between node P03-R6 and node N01-R6 via cross-linking resistive path through isolation device R6.

In another preferred embodiment of the present invention, there is provided a hardened circuit to improve immunity against single node upsets, comprising: At least two PMOS logic blocks P01 and P02, each containing a plurality of PMOS transistor gates and drains, each having a plurality of redundant PMOS inputs, and each having a single output; At least two NMOS logic blocks N01 and N02, each containing a plurality of NMOS transistor gates and sources, each having a plurality of redundant NMOS inputs, and each having a single output; At least four isolation devices R1-R2-R3-R4, wherein isolation device R1 is connected to P01 and N01, wherein isolation device R2 is connected to P01 and N02, wherein isolation device R3 is connected to P02 and N01, and wherein isolation device R4 is connected to P02 and N02.

In another preferred embodiment of the present invention, there is provided a hardened circuit to improve immunity against multi-node upsets, comprising: At least three PMOS logic blocks P01, P02, and P03, each containing a plurality of PMOS transistor gates and drains, each having a plurality of redundant PMOS inputs, and each having a single output; At least three NMOS logic blocks N01, N02, and N03, each containing a plurality of NMOS transistor gates and sources, each having a plurality of redundant NMOS inputs, and each having a single output; At least six isolation devices R1-R2-R3-R4-R5-R6,
wherein isolation device R1 is connected to P01 and N01,
wherein isolation device R2 is connected to P01 and N02,
wherein isolation device R3 is connected to P02 and N02,
wherein isolation device R4 is connected to P02 and N03
wherein isolation device R5 is connected to P03 and N03 and
wherein isolation device R6 is connected to P03 and N01.

In additional preferred embodiments of the present invention, there is provided:
a method for hardening a circuit against single node upsets by providing a hardened circuit herein;
a method for hardening a circuit against multi-node upsets by providing a hardened circuit as described herein;
wherein at least one of the transistor stacks is an inverter;
wherein at least one of the isolation devices is a resistor;
wherein the three logic cells are located in a non-linear circuit placement design architecture;
wherein the non-linear circuit placement comprises a triangular circuit placement design;
wherein it is in a multiple circuit configuration, comprising at least two hardened circuits connected in series;
wherein the two logic cells are located in an offset non-linear circuit placement design architecture.

DETAILED DESCRIPTION OF THE INVENTION

Figure 1:
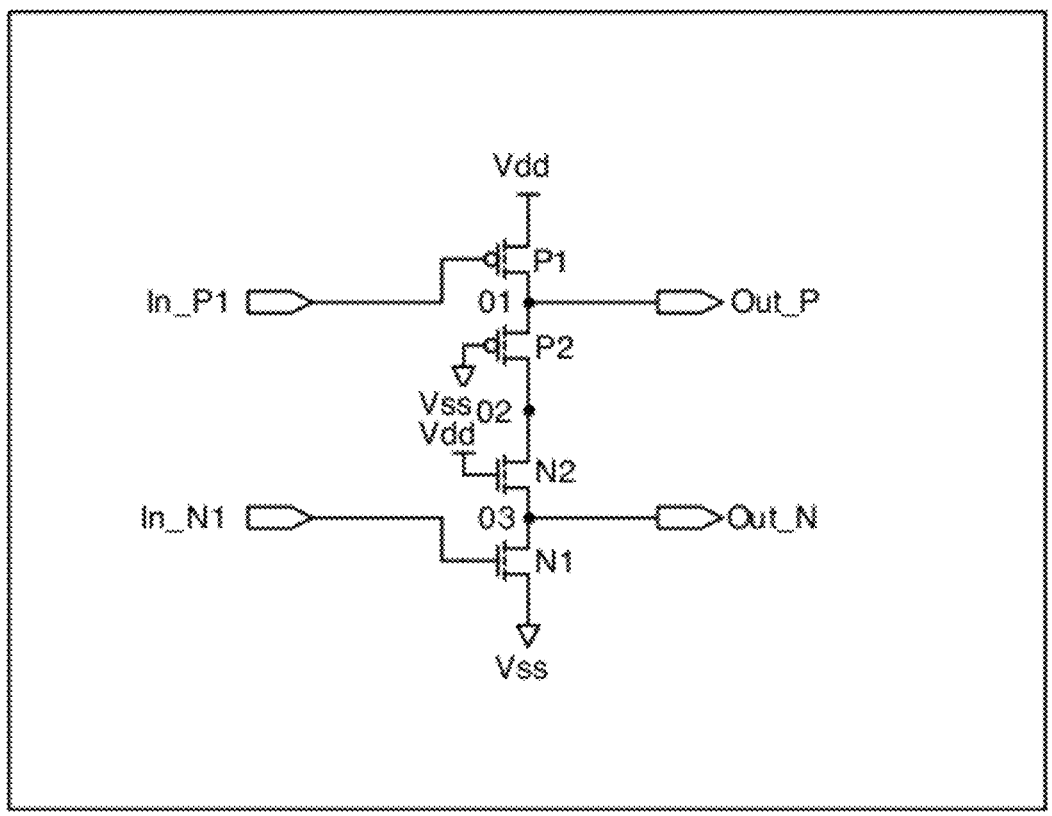
FIG. 1 and FIG. 2 are prior art showing single event tolerant cell layouts using standard isolation techniques.
Figure 2:
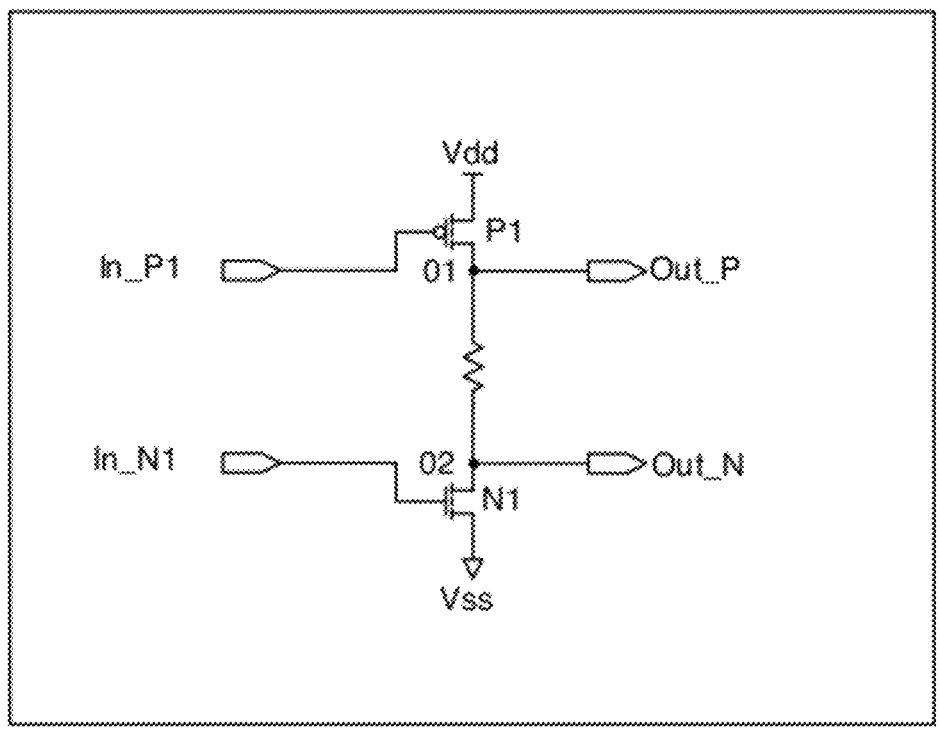

Referring now to the FIGURES, the circuit designs in FIGS. 1 and 2 demonstrate a technique to prevent a single event transient pulse from propagating through the combinatorial logic of a CMOS circuit, which can cause erroneous data to be latched into the system. By using redundant output nodes, these techniques simply limit the potential nodes that can be changed to encompass only nodes that will 'tri-state' the following logic, and therefore never propagate this upset data farther than the existing circuit.

The example circuit of FIG. 1 is a hardened inverter, with a PMOS transistor P1 and NMOS transistor N1 forming the inverter, and PMOS transistor P2 combined with NMOS transistor N2 forming the isolation path. The inverter has two stable states which are described next.

The most susceptible state for an NMOS transistor to a particle strike is when the transistor is 'off'. In a standard CMOS inverter, the NMOS drain region is pulled up to VDD (through the PMOS transistor), and the area around the drain is at VSS (the base of the transistor). When a heavy ion passes through this NMOS drain region, it will create electron hole pairs which will separate and drift in opposite directions and will be collected by the sources creating the fields. In the normal inverter gate with the NMOS transistor off, a strike through the drain region of this NMOS transistor would deposit charge, causing the circuit node to switch from VDD quickly towards VSS. Depending on the amount of charge deposited, capacitance of the node, and drive strength of the PMOS transistor, the circuit would recover back to the original state after a period of time. If the recovery time is slow enough, the deposited charge would also diffuse away and recombine (on the order of a few nano-seconds.) If the inverter is in the opposite state with the NMOS gate 'ON", this drain region would be at VSS, the same potential as the well. Without a voltage potential across this junction, a heavy ion passing through this region would essentially have no effect. This region is essentially vulnerable in only one of the two binary logic levels. The PMOS transistor has the same physical properties, but with the reversal in susceptibility. Since the PMOS base region is tied to VDD, the PMOS transistor is susceptible to a strike primarily when the drain region is at VSS. A PMOS diffusion will switch from VSS towards VDD from a heavy-ion strike, but a diffusion at VDD will remain at VDD when struck by the particle.

For the case of the redundant inputs In_P1 and In_N1 at the low logic level, nodes 01, 02, and 03 are at (essentially) the high logic level. The high logic level can only be fully high and low at nodes 01 and 03 if P2 and N2 are zero-threshold transistors. For normal transistors, the description of the hardening technique will still be valid although the output levels are at slightly diminished levels and transition slower. With the high logic level on these nodes (01, 02 and 03), any strike to the diffusion at node 01 will produce very little effect on the output node. The node is high as well as the body of these PMOS transistors, and there is no field differential to collect the charge produced by the particle strike. Any PMOS transistor in a logic gate connected to the signal labeled Out_P begins in the 'off' state before the strike and will remain in the 'off' state after the strike. A strike at node 02 or node 03 will drive nodes 02 and 03 towards the low logic level. With a high logic level driving this output node labeled Out_N, any NMOS gate connected to this signal will be actively driven before the strike by the PMOS devices connected to this node through isolation devices. Immediately after the strike, any gate connected to Out_N will switch 'off'. In this example, immediately after the strike, any logic gate with PMOS signals connected to Out_P and NMOS signals connected to Out_N will have both transistor sets 'off', or 'tri-stated' and the logic signal produced from this gate will remain in the previous state until the transient is removed (provided that the isolation circuit is properly designed, discussed below).

A similar condition exists for the opposite state. When the redundant inputs In_P1 and In_N1 are at the high logic level, nodes 01, 02, and 03 are at (essentially) the low logic level. With the low logic level on the inner nodes, any strike to the diffusion at node 03 will produce very little effect on the output node Out_N. The node is low as well as the body of these NMOS transistors, and there is no field differential to collect the charge produced by the particle strike. Any NMOS transistor in a logic gate connected to this signal labeled Out_N begins in the 'off' state before the strike and will remain in the 'off' state after the strike. A strike at node 01 or node 02 will drive nodes 01 and 02 towards the high logic level. With a low logic level driving this output node labeled Out_P, any PMOS gate connected to this signal will be actively driven before the strike. Immediately after the strike, any gate connected to Out_P will switch 'off'. In this example, immediately after the strike, any logic gate with NMOS signals connected to Out_N and PMOS signals connected to Out_P will have both transistor sets 'off', or 'tri-stated' and the logic signal produced from this gate will remain in the previous state until the transient is removed.

FIG. 2 shows another implementation of this technique, using a resistor (replacing the bias network NMOS N2 and PMOS P2 of FIG. 1) as the isolation network. The resistor provides the isolation from the struck node, again providing the circuit the ability to simply tri-state the output nodes used in the logic network until the signal recovers.

The containment of the heavy-ion induced error hinges on the circuit having a stronger current sinking capacity through P1 than the current that can pass through the isolation network (the single resistor in FIG. 2 or the bias network N2 and P2 in FIG. 1).

This type of circuit design is effective in limiting the propagation of the upset; however the circuit must still recover. The time it takes for this node to recover has been the study of many recent research efforts. In the past few years, several advances have been made in understanding the physics controlling the recovery time of a struck node. These advancements have been made both through testing of actual circuit designs and simulation models. It is now understood that the recovery time for a reverse-biased junction struck by a heavy ion will be primarily based on the amount of charge deposited and the drive strength of the transistors that can source/sink current. The higher drive transistors will recover quicker then smaller transistors. Dynamic logic and logic without a restoring force will not recover until the next precharge cycle. A strike in a diffusion that is at the same potential as the body (such as node 01 in the example above) will not change states, as there are no fields to separate the electron-hole pairs generated by the heavy ion, but this deposited charge can still cause an error in the operation of the logic. Diffusion regions that are at the same potential as the well will rely primarily on diffusion and recombination (on the order of 1-2 ns). If node 01 is at the high logic level, with the body of P1 high and is struck by a heavy ion, the charge created will remain for 1-2 ns after the strike. If the input switches state during this time period, the charge must be source/sunk by the transistors before the state change can appear at this node. For the circuit shown in the Figure above, transistor Ni will switch low, and P1 will remain high until the charge is removed. For this time period, the error will not propagate, but will still form a tri-stated signal to logic connected to this cell until node 01 can recover.

The circuit drive strength ratios are also critical for these techniques that rely on creating a tri-state output signal. If the struck node is not properly balanced in the logic design, the "isolated" node will begin to be affected. In FIG. 2, if nodes 01 and 02 are high and node 02 is struck, node 02 will switch low. If the resistor is not large enough node 01 will begin to drop to a level created by the voltage divider between the effective resistance of P1 (with ΔVoltage between drain and source at a small value) and the resistance of the isolation resistor. As this voltage changes, the transistor gate connected to this output will enter subthreshold operation and begin to change states. This can switch the state of the following gate instead of preserving the tri-state condition. This isolation network must be large enough to prevent this droop from occurring. As this isolation resistance becomes larger, it will also slow down the recovery time as this does limit the current flowing into the node. This circuit ratio sizing must be carefully considered as the architecture that allows the circuit to prevent the transmission of the error will also slow the recovery time of the circuit.

Another issue using techniques similar to those shown in FIG. 1 and FIG. 2 is the recovery time after the strike, even when the isolation technique is successful. The strike will be contained within the node of the logic, and the output virtually tri-stated until the charge can be removed. This will prevent the transient strike from propagating to other logic gates, and to any register connected to this logic path. For high-speed systems, there is still the possibility of new data that should propagate through this 'tri-stated' node will be lost during the recovery. Measurements of actual heavy-ion experimental data, as well as simulated strikes have shown several nanosecond recovery times for nodes connected to small or weakened transistors (such as these designs with resistive elements added to the circuit paths).

These hardening approaches can effectively isolate the struck node and potentially prevent the erroneous data from propagating when properly sized. However, the potential multi-nanosecond recovery time can effectively block multiple computational cycles worth of data on modern designs running in the 1 GHz range. Signals that would pass through the tri-stated logic will be lost during new clock cycles before the recovery is completed.

These designs also do not address the issues of true space-borne electronics. The energetic particles pass through the circuit from all angles. A single particle can upset multiple circuit nodes that reside within the one to two micron track width of the particle, and these circuits will often see the effects of the multiple node upset response. These techniques will work for older designs, but are not capable of preventing erroneous circuit operations from modern circuit designs in true heavy ion environments.

Figure 3:
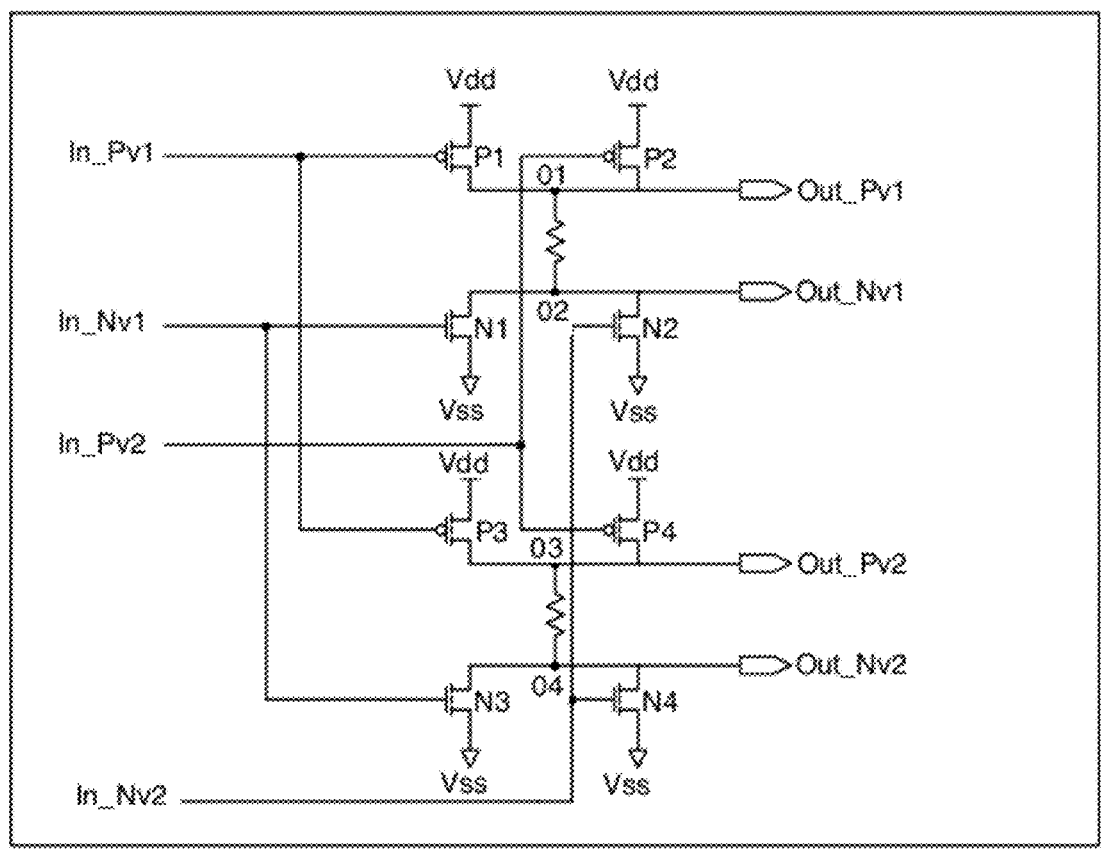
FIG. 3 demonstrates a true SEU and SET hardened logic gate using the MICE architecture with two redundant circuits.

FIG. 3 shows a robust architecture for quick recovery time from any heavy-ion strike. Nodes P1 and N1 form the original logic cell (an inverter gate for this example), and the repeated, redundant gates P3 and N3 are driven from the same input signals. The redundant inverter is formed with P4 and N4, and repeated in the first circuit with P2 and N2. Resistors are shown as the example isolation devices but the isolation device can be any element that provides the required isolation between nodes during a heavy-ion strike. This example uses the basic concept of this invention, replicating the basic structure and couple this repeated gate with the original in a fashion that will allow the data flow to proceed if one of the redundant gates is struck. It is assumed that the base logic style will use an architecture that will overdrive the struck node and the upset can only lead to a tri-stated output instead of an improper drive condition to the following logic gates. This allows the following gate to combine the redundant circuits in a parallel fashion: if one gate is tri-stated, the other redundant gate will drive to the correct value and the logical date will proceed as normal. There are different architectures for building this type of logic gate, the basic cell must contain the transient strike and tri-state downstream logic until the circuit recovers. There are now four redundant inputs and outputs to this logic gate, but these additional signals and gates will still provide isolation to a heavy-ion strike, and redundant signals that allow the logic to proceed without waiting for the tri-stated nodes to recover. (The full example is described below).

The circuit shown in FIG. 3 will continue to operate with minimal penalty from a single event strike in the logic. This is a robust circuit that will lead to a low error rate in a true orbit, but the circuit as shown in FIG. 3 will not eliminate all errors. The problem with the circuit shown in FIG. 3, and any other circuit architecture relying on a redundant node (such as DICE) can be visualized when one understands that it is impossible to place two nodes in a fashion that a single ion track cannot upset both nodes. Virtually all architectures and mitigation schemes used by designers of integrated circuits for space environments assume that the error-inducing heavy-ion will strike only a single node in a circuit (hence the focus on SINGLE event upsets). This is a wildly optimistic approach to IC design now being recognized by the community, leading to the demise of many standard circuit hardening techniques. The true space environment will produce heavy-ion strikes from all angles on the device. The probability of striking two nodes from the same ion track appears to be very small at first glance. A common calculation uses the separation of critical nodes and the ion track width to calculate the reduction in error rate [**]. Until recently, the rule of thumb for the ion track diameter was 50 nm. For the true space environment, iron ions can actually have track diameters between 1 um and 2 um, which is at least 20× larger diameter than that used in older error rate calculations. Research into this topic [Mavis et al., IRPS paper] shows a surprisingly large distance needed to gain the error-rate reduction expected over the original error rate. This can be determined from existing (Mavis et al.) data, where, for example, 100 um gives a multiple of orders of magnitude reduction. Clearly, the requirement of a double node hit over a single node hit will make a circuit design much more robust, but will still see many heavy-ion upsets when operating in space. What is required is a circuit design that can be extended to an architecture requiring 3 nodes to be struck in order to produce the error, and place these critical nodes in a fashion that all three nodes cannot be hit simultaneously by any ion track.

Figure 4:
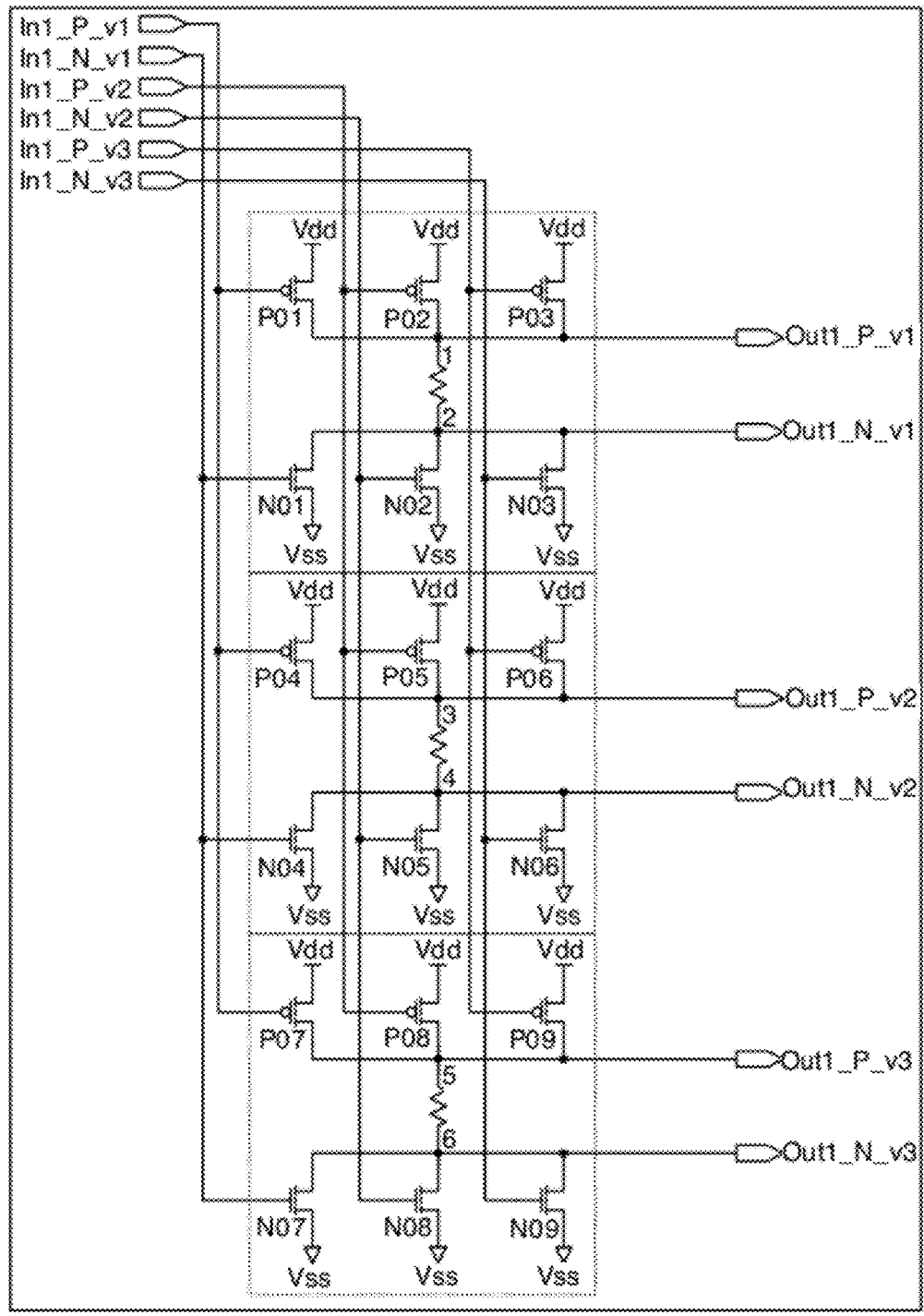
FIG. 4 demonstrates a layout capable of operating through a multi-node strike using the MICE architecture with three redundant circuits.

Finally, FIG. 4 shows how this invention can be implemented in a truly robust method that, if properly implemented, will be immune to all upsets in space. This is a continuation of the redundancies performed and shown in FIG. 3. A third redundant column is added to each block, and a third circuit is added as a redundant path. In FIG. 4, there are three redundant blocks, each performing the logic function (an inverter for this example). Inside each block, there are three parallel CMOS transistor stacks, forming a tightly coupled circuit. There are now six inputs and six outputs. Transistors P01, P02, and P03 are combined with transistors N01, N02, and N03 (plus the isolation device shown as a resistor) form the first full inverter. Transistors P04, P05, P06 are stacked with transistors N04, N05, and N06 (plus the isolation resistor) to form the second inverter. Transistors P07, P08, and P09 are connected through the isolation resistor to transistors N07, N08, and N09 to form the final inverter. By using the combination of the tightly coupled redundant nodes and isolation devices, this architecture can be shown to be immune to any heavy-ion induced upset. As long as the three redundant circuits are placed in the design so that a single linear heavy-ion track will not strike all three circuits, the design will continue to function, showing only a minor speed penalty for this specific logic gate (which at modern processes of 2010, CMOS logic gate operations can be on the order of 10 ps, compared to the 1-2 ns recovery time of a weak recovery transistor).

Description of Single Node Upset Immunity Hardening

Figure 5:
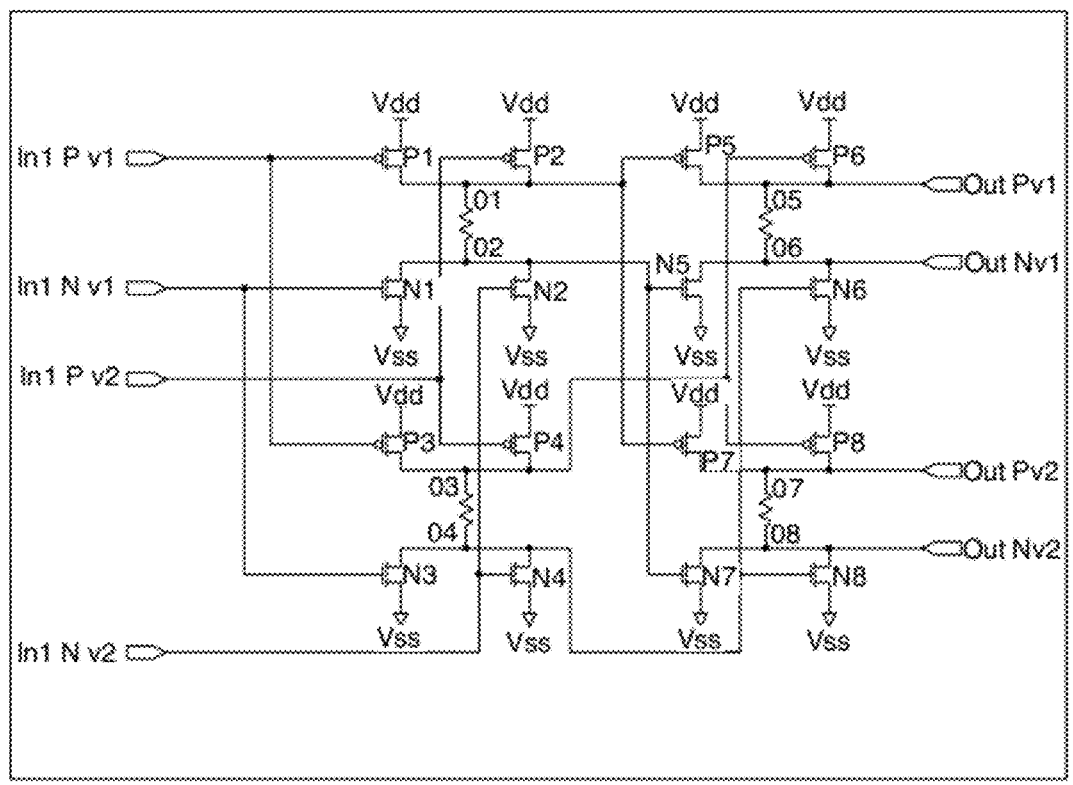
FIG. 5 shows an example circuit inverter using the MICE architecture connected to a second inverter to demonstrate the single node upset immunity.

An example of how the simplified invention provides immunity to single node upsets is shown in FIG. 5. This figure uses the same example logic as FIG. 3 (an inverter cell) with a second inverter connected to demonstrate how the circuit will operate around the heavy-ion strike. For this example, all inputs are low, nodes 01, 02, 03, 04 are high before the strike. The output nodes are all low before the strike. If in this configuration, the diffusion of N01 or N02 is struck by a cosmic ray, node 02 will switch from high to low. Immediately, the gates of the NMOS transistors N05 and N07 switch from high (on) to low (off). Node 01 is isolated by the resistor, so node 01 remains high. With node 01 high, and the redundant node 03 high, all PMOS transistors connected to these nodes (P05, P06, P07, and P08) remain high (off). Without the redundant networks, the outputs would be tri-stated, waiting for the circuit to recover from the heavy-ion strike. With the redundant circuit driving NMOS transistors N06 and N08, the outputs will switch correctly even while the original circuit struck by the heavy ion produces tri-stated signals and slowly recovers. In fact, the redundant network (P03, P04, N03, N04) will continue to operate and pass valid data with any transition on the input nodes as well. This circuit will provide the same functioning circuit result from any single node strike. However, if this circuit experiences a glancing strike (flipping the state of node 02 and node 04 simultaneously), this circuit will tri-state until the charge is removed. Therefore, additional nodes must be inserted into this design to provide full multi-node immunity.

Description of Multiple Node Upset Immunity Hardening

Figure 6:
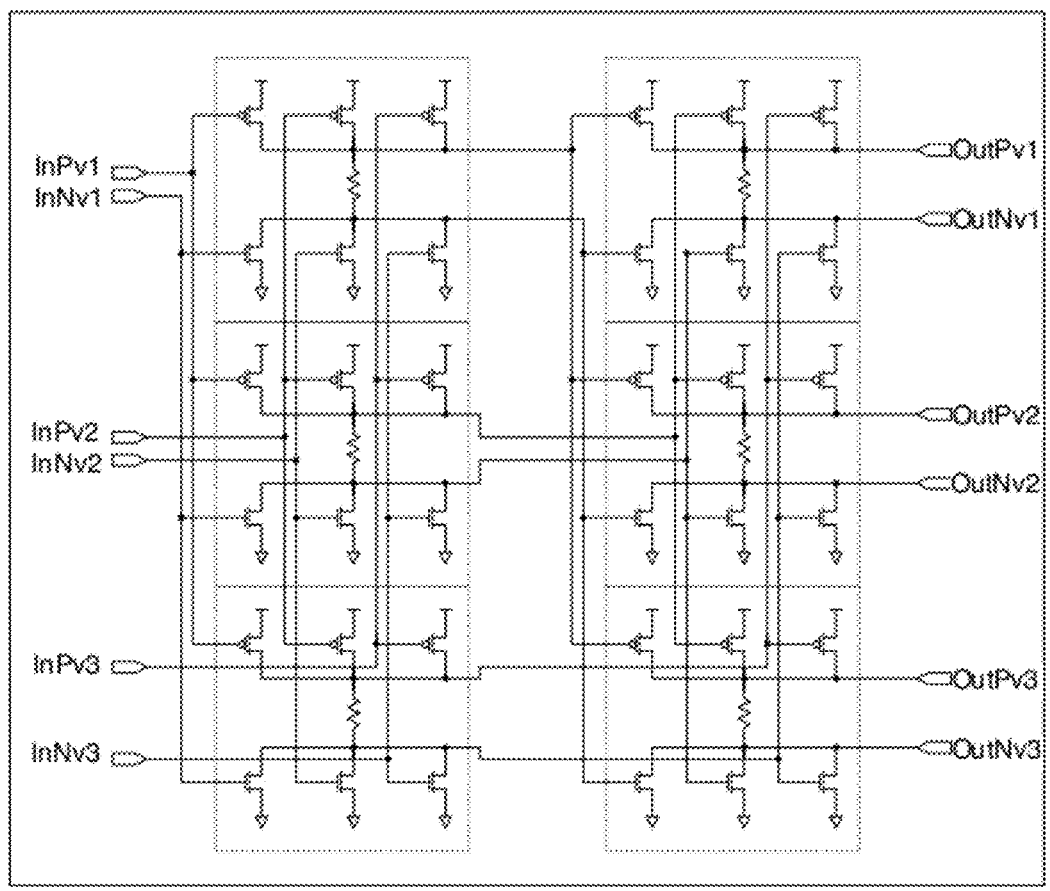
FIG. 6 shows an example circuit inverter using the MICE architecture connected to a second inverter to demonstrate the multiple node upset immunity.
Figure 7:
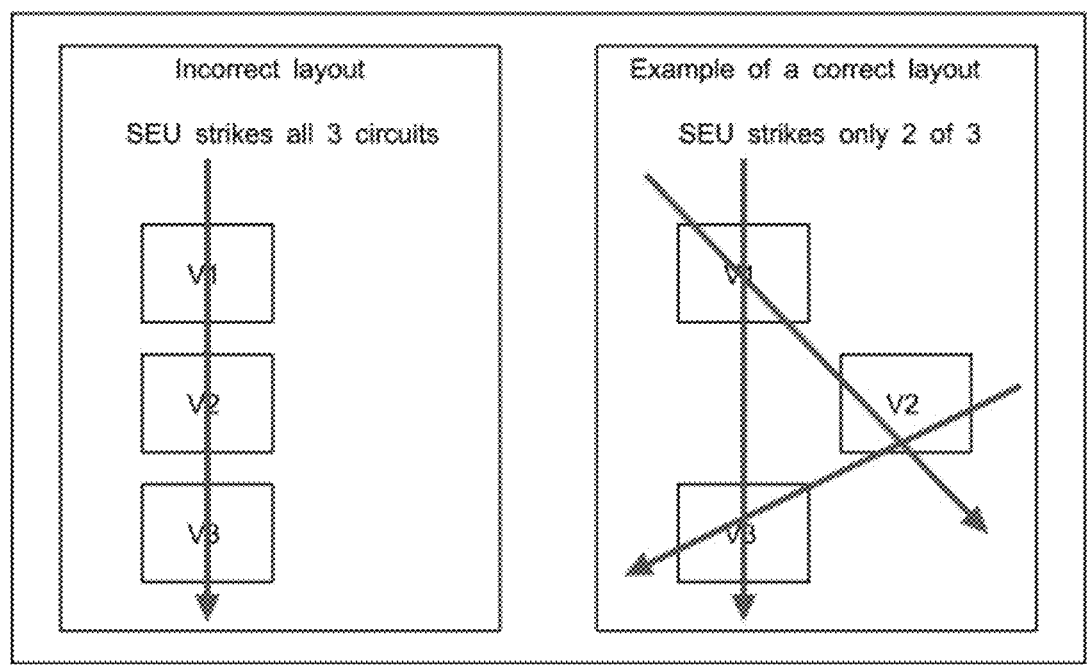
FIG. 7 is a block diagram illustrating a correct layout technique for use with the MICE layout technique, enabling the multi node upset immunity.

An example of how the full architecture described in this invention provides immunity to multiple node upsets is shown in FIG. 6. This figure uses the same example logic as FIG. 4 (an inverter cell) with a second inverter connected to demonstrate how the circuit will operate around the heavy-ion strike. For this example, all inputs are low, nodes 01, 02, 03, 04, 05, and 06 are high before the strike. The output nodes are all low before the strike. If in this configuration, a glancing strike flips the state of the diffusions connecting to nodes 04 and 06, and both nodes will switch from low to high. Immediately, the gates of the NMOS transistors nodes N11, N12, N14, N15, NN17, and N18 switch from high (on) to low (off). Node 03 and 05 are isolated by the resistors, so they remain high. With node 01, 03, and 05 at the logic high level, all PMOS transistors connected to these nodes (P10 through P18) remain high (off). With the single correct redundant circuit driving NMOS transistors N10, N13, and N16, the outputs will operate correctly even while the two flipped circuits produce tri-stated signals and slowly recover. In fact, the redundant network (P01, P02, P03, N01, N02, N03, plus the isolation resistor) will continue to operate and pass valid data with any transition on the input nodes as well. This circuit will provide the same functioning circuit result from any single node strike. FIG. 7 shows two example layouts for these redundant networks. As long as the three networks are not placed where the linear track of the particle can strike all three nodes, there will be an untouched logic block that will provide the correct logic signals. The separation of the three redundant blocks should be larger than the ion track diameter expected for the desired technology when exposed to the space environment.

Alternate Circuit Architecture for the Multiple Node Upset Immunity Hardening

Figure 8:
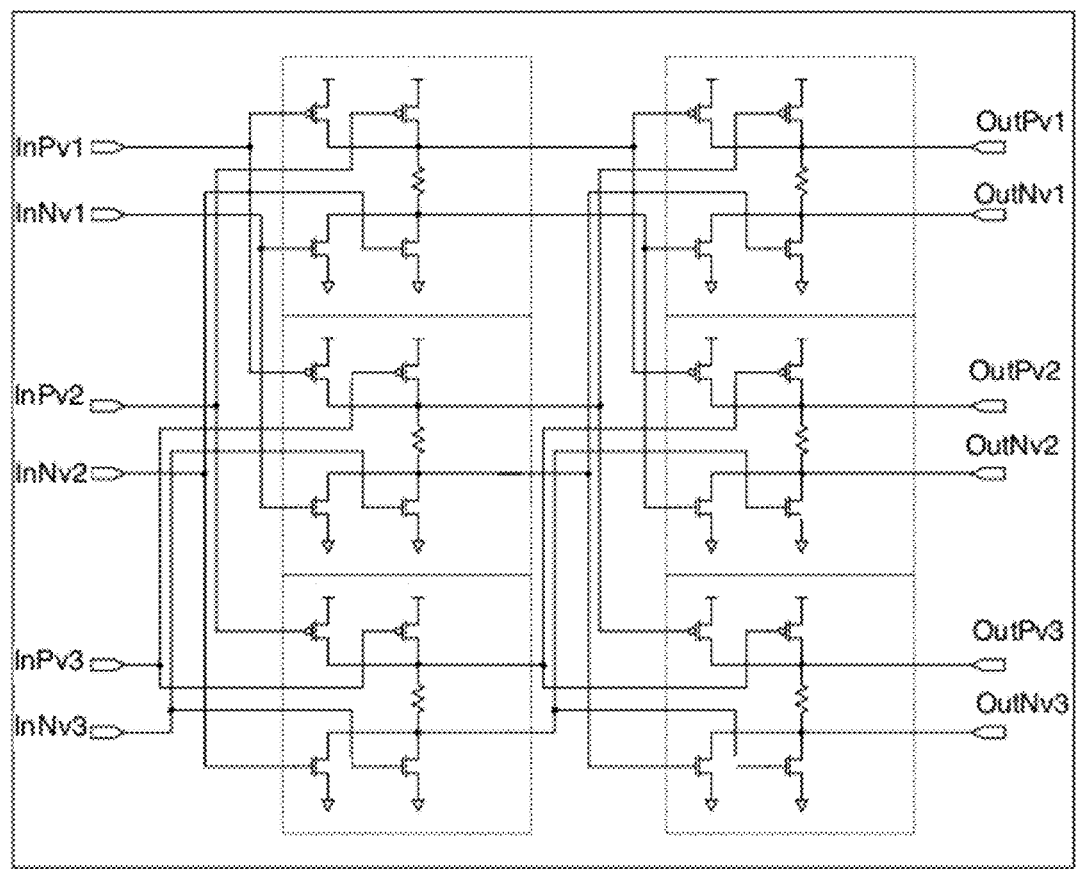
FIG. 8 demonstrates an alternate layout example of the MICE layout technique.

FIG. 8 shows an alternate technique for building a multiple node upset immune logic gate. This architecture still uses three redundant networks for the logic gate (an inverter in this example) but removes one of the internal redundant transistor NP columns. By simply distributing the output nodes so the following three redundant nodes receive all combinations of these gates (v1+v2), (v1+v3), (v2+v3), the following redundant gates will produce the correct output signals, although one of the three networks will be tri-stated after a multiple node strike. This requires fewer transistors, but will recover slower from a multi-node strike.

Alternate Architecture for Single Node Upset Immunity

Figure 9:
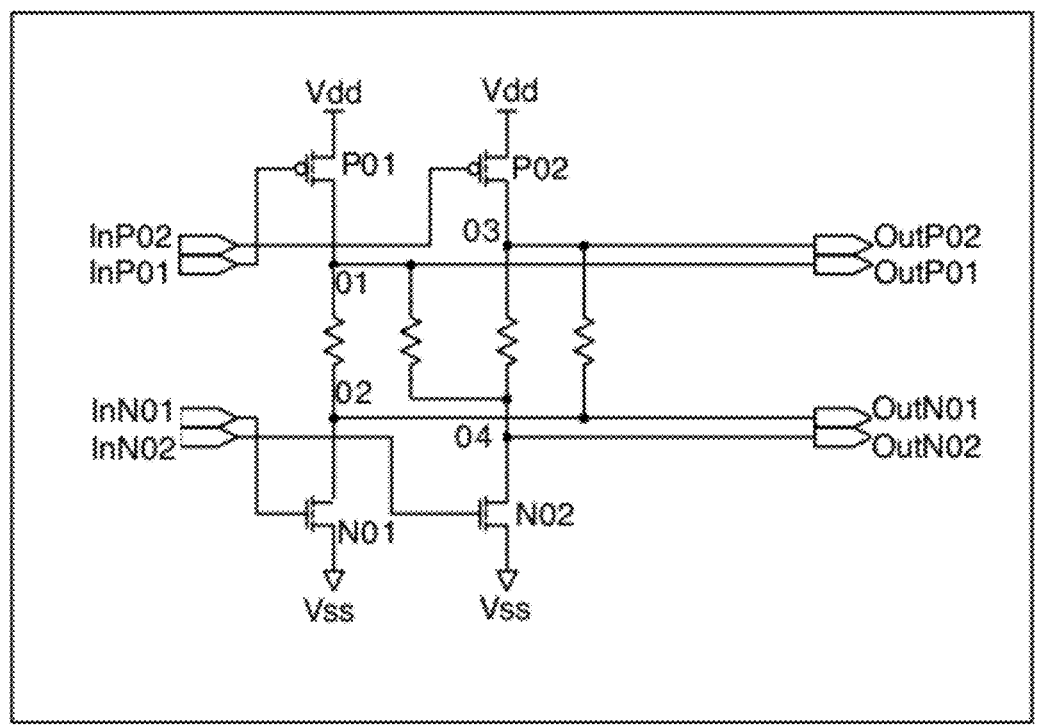
FIG. 9 shows an alternate layout to FIG. 3, using four resistors and four transistors.

FIG. 9 shows an alternate circuit design for the single node upset immune logic described in this invention. This circuit uses four transistors and four resistors to provide the same hardening level as the circuit shown in FIG. 3. The circuit still contains the four redundant circuit nodes (01, 02, 03, 04) but uses four resistors instead of the two isolation resistors. By using two resistors between each transistor and the two opposite transistor types, the resistors are no longer simply isolation resistors but are used to allow a higher level of active circuit recovery to the struck node. A single struck node will generate a tri-state signal to the logic gates connected to this circuit, as well as proper signals from the redundant circuit block. As an example, if all inputs are low, the output nodes should all be high. A strike to node 02 will switch the node from a high to a low, again providing a low (off) signal to any NMOS gate connected to this output. The circuit also has the benefit of a quicker recovery, as the struck node is actively driven by both P01 and P02 through the isolation paths, providing twice the source/sink capability. This circuit is still vulnerable to a multi-node strike on a linear track that can flip the state of both redundant paths.

Final Architecture to Consider

Figure 10:
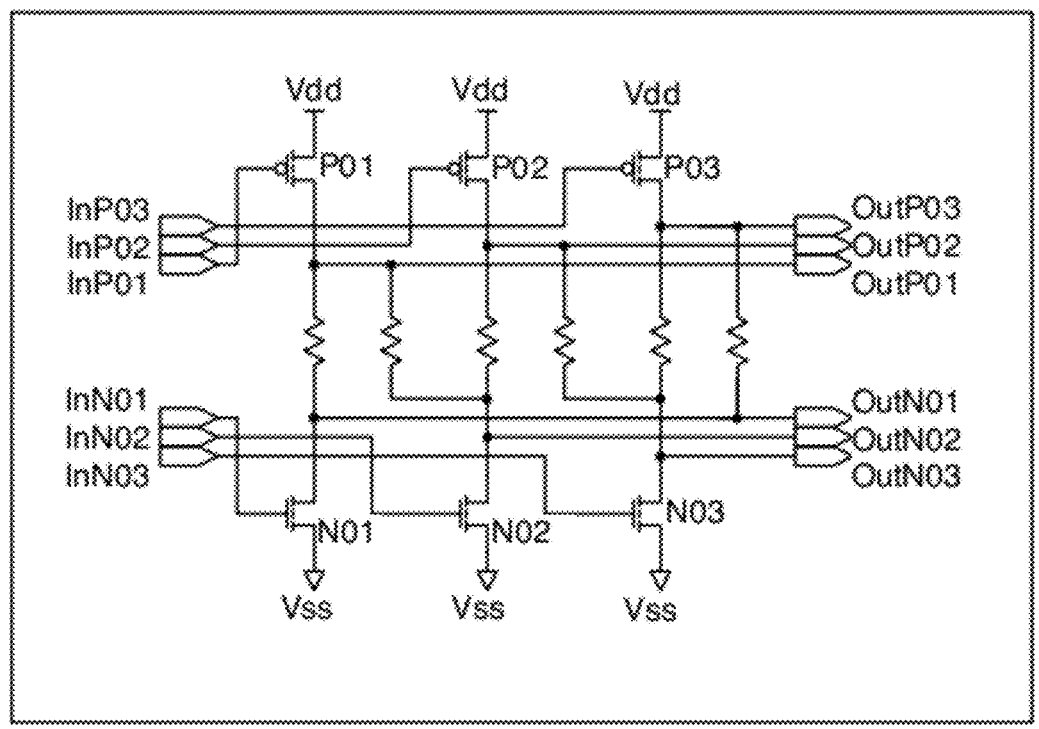
FIG. 10 shows an alternate layout to FIG. 4, using six resistors and six transistors.

A final implementation of this architecture uses six resistors and six transistors in place of the 18 transistors and 3 resistors shown in FIG. 10. These resistors connect in a fashion to create circuit similar to a logic majority gate using resistive elements for separating and filtering strikes in the NMOS/PMOS transistor stacks. The redundant nodes still retain circuit isolation through the pairs of resistors. If any of these redundant nodes is struck by a heavy ion, it will go to the tri-state condition, but will recover quicker due to the resistive coupling between this gate and the opposite type transistors. This also will limit the propagation of the tri-stated node as the following gate will compensate for this tri-stated input with a parallel gate supplying the correct value. Similar to the circuit of FIG. 4, the circuit will continue to operate as designed through the correct path and allow the tri-stated nodes to recover as long as one of the redundant nodes retains the correct data. This circuit will provide full immunity to any single heavy-ion track passing through this circuit from any angle as long as all three circuits do not reside on a linear region with all three susceptible nodes within the ion track diameter (1 to 2 um for a high energy particle in space). Any alternate layout shape (such as the 'L' shape shown in FIG. 7) will provide full immunity.

Generic Block Diagram for Single Node Immunity Version of this Invention

Figure 11:
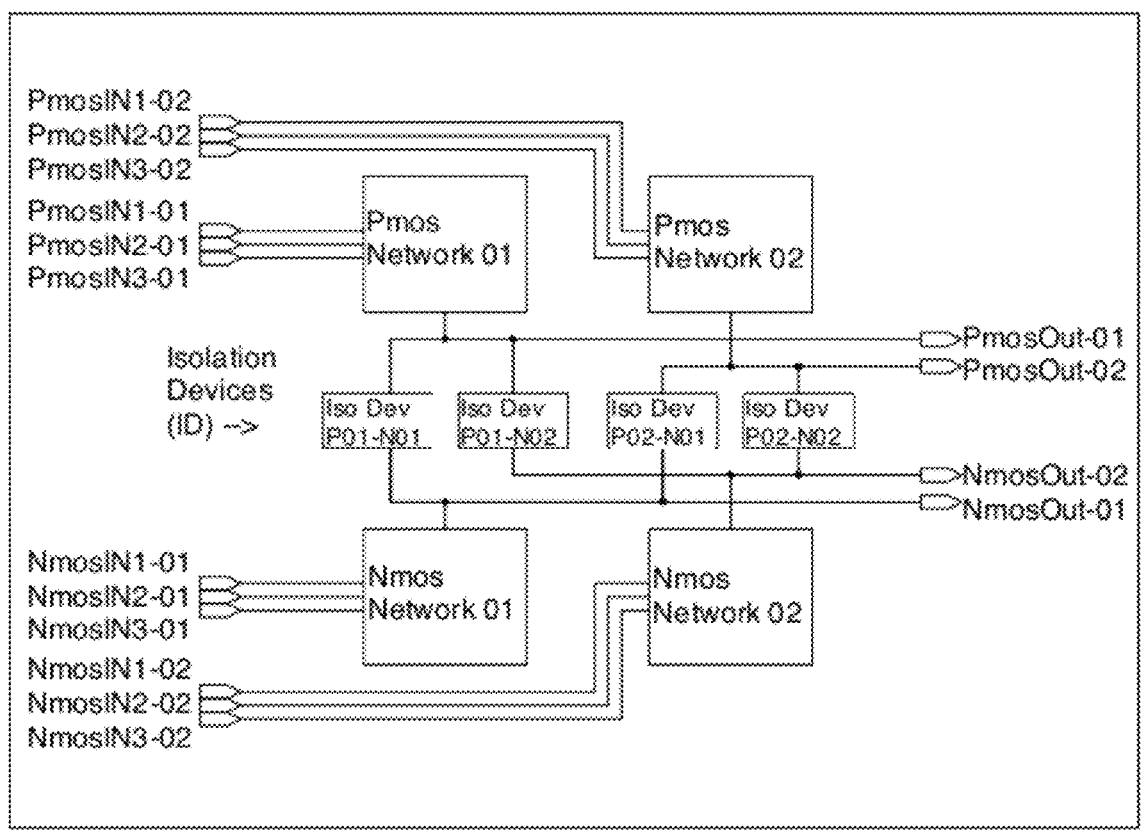
FIG. 11 is the generic block diagram of the MICE single node upset immunity technique for implementing any standard logic gate including latches and flip-flop designs.

Although all the examples previously shown have focused on an inverter, this technique can easily be expanded into use for any CMOS logic gate. FIG. 11 shows the basic concept for the single node immunity architecture. Instead of a single NMOS/PMOS stack, the full logic for the NMOS and PMOS stacks are placed into the blocks and connected to the opposite transistors as shown. Every input/output that begins as a single signal in an unhardened gate becomes 4 signals, two for the PMOS gates and two for the NMOS gates. This can easily be seen as expanding the logic shown FIG. 3 to a full logic family as well by replacing each transistor with the appropriate transistor network forming the logic gate.

Figure 12:
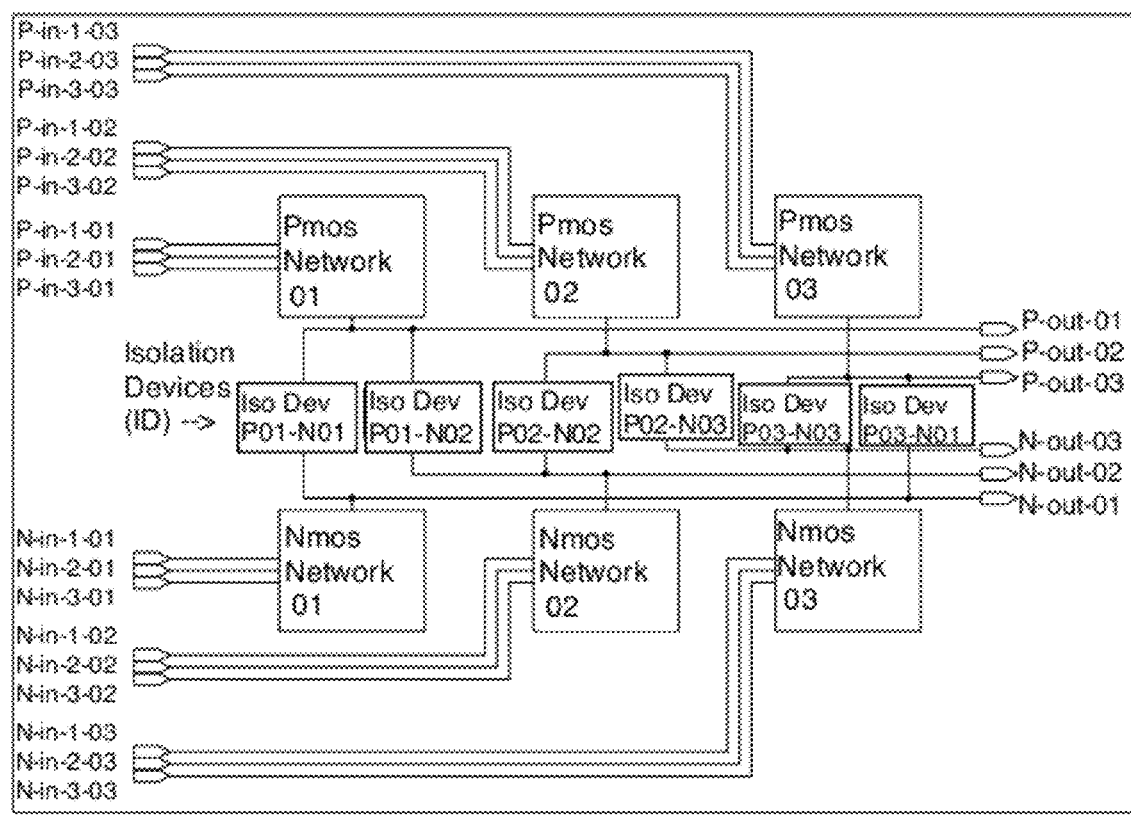
FIG. 12 is the generic block diagram of the MICE multiple node upset immunity technique for implementing any standard logic gate including latches and flip-flop designs

FIG. 12 shows the block diagram for constructing any multiple node upset immune logic gate using the techniques described in this invention. Each PMOS/NMOS network is replicated so that there are more than two redundant nodes in the logic gate (although all examples show a maximum of three redundant nodes, this can be expanded to even larger numbers of redundant nodes which can be of use when trying to limit any speed degradation in custom, small, high-speed circuits). Once there are more than two nodes in the circuits described by this invention, the cell layout can be performed so that there is no single ion track that will upset all the redundant nodes simultaneously. Again, this concept can easily be expanded to the circuit architecture shown in FIG. 4 and even the circuit shown in FIG. 8 to generate full cell libraries of single node upset immune logic and multiple node upset immune logic.

This invention can be used to create single and multiple node immune logic cells including all typical logic gates (inverters, Nand, And, Nor, Or) and any register such as a flip-flop or latch structure. One could apply this to other logic types, provided the buffering of any PMOS/NMOS gates can overdrive the isolation networks.

Figure 13:
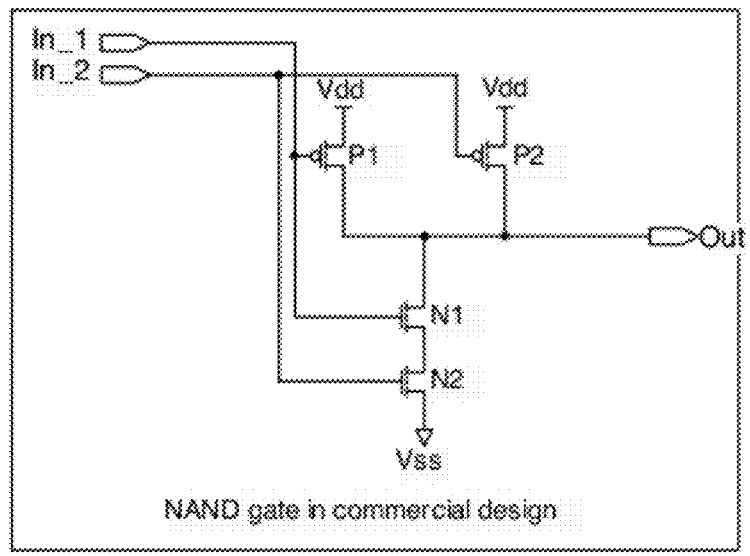
FIG. 13 is an illustration of a commercial NAND gate.

FIG. 13 is an illustration of a commercial NAND gate.

Figure 14:
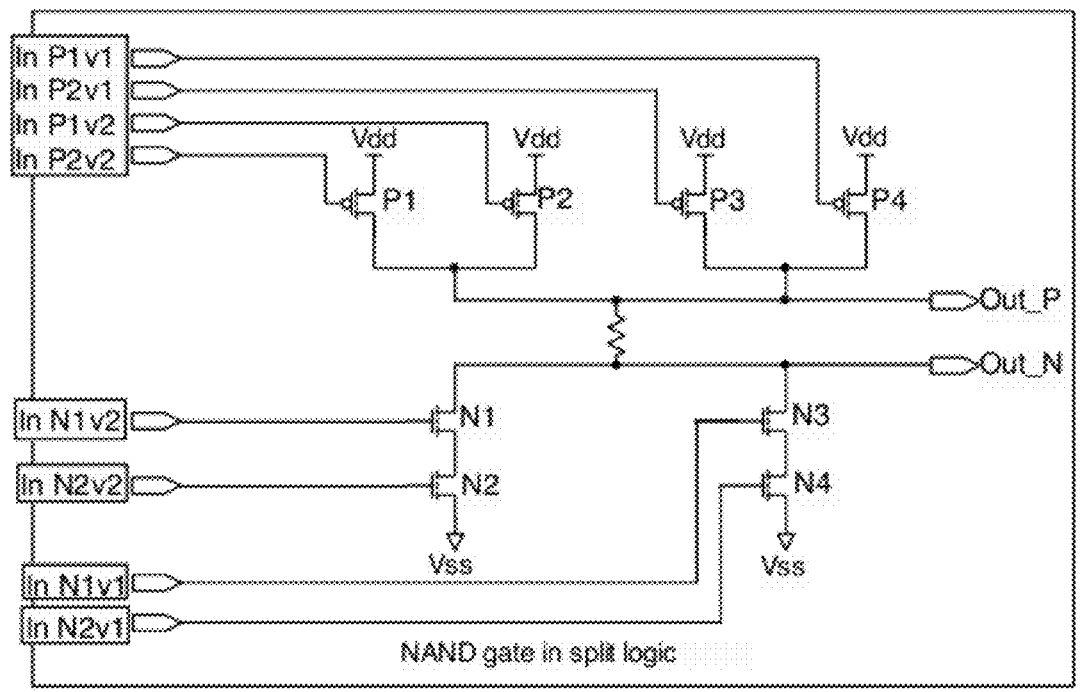
FIG. 14 is one embodiment of an illustration of a NAND gate according to the present invention.

FIG. 14 is one embodiment of an illustration of a NAND gate according to the present invention.

This technique could even be used to harden an SRAM base cell, although the area penalties would severely impact the areas in which this hardened cell would have an advantage over other techniques. However, it is easy to imagine the use of the MICE logic described in this patent as a way to harden the peripheral circuitry surrounding the SRAM blocks and other IP core blocks. For SRAM hardening, many inventions have focused on hardening the SRAM base cell itself, neglecting the peripheral circuitry. If a strike occurs in the peripheral circuitry, many uncorrectable errors can occur such as good data being stored into SEU upset immune SRAM cells, but at the wrong address caused by an incorrect word line decode occurring from a transient strike in this peripheral logic. The MICE architecture could harden this peripheral logic to a level that can be corrected by existing techniques. An example of such architecture is an SRAM that has each bit in a word separated by a large distance, and an error detect and correct (EDAC) logic block built into the SRAM. Such a distributed SRAM can handle a local upset, storing a single bit at the wrong location, that will be corrected by the EDAC logic. An uncorrectable error occurs when a transient appears on one of the global signals, decoding all bits to the wrong locations. Hardening this global logic with a technique such as the one described in this invention would make it easier to create a working EDAC design.

Another example for this technique is for use in any custom high-speed application. Several techniques have been developed through past research that can mitigate an SET event before it is stored into a register. Virtually all of these techniques rely on some form of delay that must be larger than the transient pulse width. For most high-speed applications, this delay period will prevent the custom block from operating. An example of this type of circuit could be a SERDES or phase locked loop (PLL). The digital portion of these designs can be very sensitive to heavy-ion upsets and are extremely difficult to harden to transients. The techniques described in this invention could easily be used to replace these digital logic sections, potentially even replacing certain analog portions (like the charge pump) with a pure digital version that can be hardened as well.

Another potential use for the MICE logic would be to harden the critical control lines connected to IP blocks. The MICE logic could be used to create upset immune clock grids and control lines (such as SET and RESET of registers) that have been notoriously difficult to harden, and the heavy-ion strikes to these control lines can create upsets in multiple logic devices spread throughout a chip, sharing this common control line.

Other analog devices (such as analog-to-digital converters and digital-to-analog converters) that contain portions of digital circuits could be enhanced with the MICE invention as well.

The references recited herein are incorporated herein in their entirety, particularly as they relate to teaching the level of ordinary skill in this art and for any disclosure necessary for the commoner understanding of the subject matter of the claimed invention. It will be clear to a person of ordinary skill in the art that the above embodiments may be altered or that insubstantial changes may be made without departing from the scope of the invention. Accordingly, the scope of the invention is determined by the scope of the following claims and their equitable Equivalents.

What is claimed is:

1. A MICE Logic gate comprising three (3) split logic gates, each split logic gate comprising three (3) logic function blocks with an isolation device between each connecting node, each logic function block comprising one (1) NMOS transistor and one (1) PMOS transistor and wherein the three split logic gates are not in a linear track.

2. The MICE Logic gate of claim 1, wherein a logic function is configured to be an inverter.

3. The MICE Logic gate of claim 1, wherein a logic function is configured to be a flip-flop.

4. The MICE Logic gate of claim 1, wherein a logic function is configured to be a NAND gate.

5. The MICE Logic gate of claim 4, wherein the NAND gate is combined with an inverter to form an AND gate.

6. The MICE Logic gate of claim 1, wherein a logic function is configured to be a NOR gate.

7. The MICE Logic gate of claim 1, wherein a logic function is configured to be a register.

8. A split logic function for use as a component of a multiple interlocked (MICE) logic cell where the split logic function comprises:
   a PMOS network connected with an isolation device to an NMOS network,
   wherein the PMOS network comprises a plurality of PMOS gates connected in parallel, and wherein the NMOS network comprises a plurality of NMOS gates connected in parallel equal to the number of PMOS gates,
   wherein the split logic function comprises a PMOS input and output connected to the PMOS network, and a NMOS input and output connected to the NMOS network, and
   wherein the split logic function has a Voltage drain and source.

9. The split logic function of claim 8, wherein the isolation device is a resistor.

10. The split logic function of claim 8, configured to be an inverter.

11. The split logic function of claim 8, configured to be a flip-flop.

12. The split logic function of claim 8, configured to be a NAND gate.

13. The split logic function of claim 8, configured to be an AND gate.

14. The split logic function of claim 8, configured to be a NOR gate.

15. The split logic function of claim 8, configured to be a register.

16. The split logic function of claim 8, wherein the plurality of PMOS gates is two PMOS gates in parallel, wherein the plurality of NMOS gates is two NMOS gates in parallel, and wherein each PMOS gate and NMOS gate has an input and an output.

17. The split logic function of claim 8, wherein the plurality of PMOS gates is at least three PMOS gates in parallel, and wherein the plurality of NMOS gates is at least three NMOS gates in parallel, and wherein each PMOS gate and NMOS gate has an input and an output.

18. The split logic function of claim 8, wherein the plurality of PMOS gates is at least four PMOS gates in parallel, and wherein the plurality of NMOS gates is at least four NMOS gates in parallel, and wherein each PMOS gate and NMOS gate has an input and an output.

* * * * *